United States Patent
Wooten et al.

(10) Patent No.: US 6,271,112 B1
(45) Date of Patent: Aug. 7, 2001

(54) INTERLAYER BETWEEN TITANIUM NITRIDE AND HIGH DENSITY PLASMA OXIDE

(75) Inventors: Christopher L. Wooten, Austin; Craig W. Christian, Buda; Thomas E. Spikes, Jr., Round Rock; Allen L. Evans; Tim Z. Hossain, both of Austin, all of TX (US)

(73) Assignee: Advanced Micro Devices, Inc.

( * ) Notice: Subject to any disclaimer, the term of this patent is extended or adjusted under 35 U.S.C. 154(b) by 0 days.

(21) Appl. No.: 09/191,763

(22) Filed: Nov. 13, 1998

(51) Int. Cl.⁷ .............................................. H01L 21/4763
(52) U.S. Cl. ..................... 438/618; 438/627; 438/624; 438/787; 438/628; 438/648
(58) Field of Search ................... 438/618, 778, 438/787, 788, 627, 624, 637, 628, 648

(56) References Cited

U.S. PATENT DOCUMENTS

| | | | |
|---|---|---|---|
| 4,829,024 | 5/1989 | Klein et al. | 437/189 |
| 5,420,070 | 5/1995 | Matsura et al. | 437/190 |
| 5,679,606 | * 10/1997 | Wang et al. | 438/778 |
| 5,686,761 | 11/1997 | Huang et al. | 257/753 |
| 5,913,140 | * 11/1999 | Roche et al. | 438/624 |
| 5,976,993 | * 11/1999 | Ravi et al. | |
| 6,046,106 | * 4/2000 | Tran et al. | 438/660 |

FOREIGN PATENT DOCUMENTS 10074835   3/1998 (JP).

OTHER PUBLICATIONS

HDP–CVD: Trying to lasso lighting, Ed Korczynski, Solid State Technology, Apr. 1996.

* cited by examiner

Primary Examiner—Caridad Everhart
(74) Attorney, Agent, or Firm—Williams, Morgan & Amerson

(57) ABSTRACT

A method for reducing die loss in a semiconductor fabrication process which employs titanium nitride and HDP oxide is provided. In the fabrication of multilevel interconnect structures, there is a propensity for defect formation in a process in which titanium nitride and HDP oxide layers are in contact along the edge of a semiconductor substrate. A dielectric interlayer is provided which improves the interfacial properties between titanium nitride and HDP oxide and thereby reduces defects caused by delamination at the titanium nitride/HDP oxide interface.

27 Claims, 5 Drawing Sheets

INTERLAYER BETWEEN TITANIUM NITRIDE AND HIGH DENSITY PLASMA OXIDE

BACKGROUND OF THE INVENTION

1. Field of the Invention

This invention relates generally to improving the interfacial properties between titanium nitride and high density plasma oxide during semiconductor fabrication, and, more particularly, to the use of an engineered interlayer between these two materials in order to improve the stability of the interface during high temperature processing steps.

2. Description of the Related Art

In the manufacture of high performance integrated circuits, many active devices are fabricated on a single substrate. Initially, each of the devices must be electrically isolated during device fabrication. However, later in the process, specific devices must be interconnected in order to effect the desired circuit function. The increasing chip density necessary for very large scale integration (VLSI) and ultra large scale integration (ULSI) devices requires that larger numbers of semiconductor devices, e.g., transistors, be present on the wafer surface, which, in turn, has decreased the area available for surface wiring. As a result, multilevel conductive interconnection schemes are needed. For example, this may be achieved by using multiple levels of sequentially formed metal conduction lines, each level of such lines separated by insulating layer of dielectric material. These dielectric layers are generally known as intermetal dielectrics (IMD) or interlayer dielectrics (ILD). Via holes formed within the layer of dielectric material are filled with a conducting material to form a conductive plug that connects the metal lines formed at different levels.

In one example of forming a multilevel interconnection structure, high density plasma (HDP) oxide, deposited by high density plasma chemical vapor deposition (HDP-CVD), is formed adjacent conductive structures, e.g., conductive lines. High density plasma CVD has become a process of choice for sub-0.5 um intermetal dielectric gap-fill (for example, see Korczynski, E., Solid State Technology, April 1996, pg. 63). A second dielectric, such as a tetraethyl orthosilicate (TEOS) oxide, may be deposited on the surface of the HDP oxide layer. The TEOS layer provides good dielectric properties and can be applied relatively inexpensively by deposition processes that are well established within the industry. The selection of the appropriate dielectric materials for these layers will be governed, for the most part, by cost, performance and operating requirements for a given application.

FIG. 1 is representative of a prior art interconnect structure at an intermediate stage during multilevel interconnect fabrication. Illustrative conductive line 130 is formed by depositing and patterning a layer of conductive material, e.g., aluminum, above the surface 101 of a substrate 100. Intermetal dielectric layers, such as an HDP oxide layer 110 and a TEOS oxide layer 140, are formed as shown in FIG. 1. After etching a via 190, through the TEOS oxide layer 140, and extending to the upper surface 131 of the conductive line 130, it is generally necessary to provide a titanium-titanium nitride (Ti—TiN) barrier system along the sidewalls of the via 190. Thus, after forming the via 190, a layer of titanium 150 is deposited in the via 190. Titanium provides good ohmic contact with the underlying conductive line 130, and also serves as an adhesion layer between the conducting metal 180, e.g., tungsten, and the sides of the via 190. However, as the titanium layer 150 is very reactive, and subsequent tungsten deposition can damage the exposed titanium, a titanium nitride (TiN) layer 160 is deposited on the surface of the titanium layer 150. Thus, the sidewalls of the via 190, in addition to a portion of the upper surface 131 of the conductive line 130 exposed by the via 190, are coated with a titanium-titanium nitride barrier layer. The via 190 is thereafter filled with a conducting metal 180, such as tungsten, resulting in the tungsten plug interconnection structure depicted in FIG. 1. By repeating the above process, a multilevel interconnect structure comprising alternating layers of conductive lines and conductive plugs may be formed above the surface of the wafer.

During the formation of such multilevel interconnections, there is a propensity for defect formation when HDP oxide and titanium nitride are used in the same process. During certain of the process operations described in the above fabrication sequence, the semiconductor wafer is clamped along its outer circumference, and materials are thereby prevented from contacting the surfaces along the wafer edge that are covered by the clamps. With reference to FIG. 2, these clamps (not shown) generally contact the wafer 201 along its edge 200 and may extend for a distance of about 3–5 mm, or greater, inward from the edge 200 of the wafer substrate 201. The clamps may contact the wafer in any of a number of configurations. Some clamps may contact the wafer around its entire circumference, while other clamps may utilize finger-like projections at a plurality of positions along the wafer edge 200. Regardless of clamp configuration, the regions along the edge of the wafer 201 that are contacted by the clamp are shielded from the processing materials to which the wafer 201 is exposed in a given fabrication process. For example, because the wafer 201 is clamped during a titanium deposition process, titanium is not deposited along the edge 200 of the wafer 201 that is contacted by the clamp. However, during other processing steps, such as formation of HDP oxide, TEOS oxide, and titanium nitride, the edge 200 of the wafer 201 may be unclamped. Consequently, during these processes, materials do contact the surface of the wafer 201 along the edge 200, and have a tendency to accumulate thereon. For example, as depicted in FIG. 2, layers of titanium nitride 210, HDP oxide 220 and TEOS oxide 230 form along wafer edge 200 during processing. This occurs many times over as multilevel interconnect fabrication proceeds.

This situation can be problematic during subsequent processing steps because of the poor interfacial properties between HDP oxide and titanium nitride. In particular, subsequent high temperature processing steps can result in delamination at the titanium nitride/HDP oxide interface, causing bubbling to occur in localized regions along the wafer edge where this delamination occurs. These regions can burst open and release small oxide discs as airborne projectiles which land randomly on the wafer surface, causing die loss and adversely effecting process yield.

The present invention is directed to overcoming, or at least reducing the effects of, the problems set forth above.

SUMMARY OF THE INVENTION

This invention broadly concerns a method of reducing the propensity for defects and thereby improving yield in a semiconductor fabrication process in which HDP oxide and titanium nitride are employed. The invention is applicable, in one example, to a process for producing multilevel interconnect structures for high performance integrated circuits. In this process, due to the nature of the techniques and tools used during fabrication, HDP oxide and titanium nitride come into direct contact and stack up along the edge of the semiconductor wafer substrate as the multilevel interconnect structure is being sequentially formed. The interface between HDP oxide and titanium nitride along the wafer edge is susceptible to delamination during subsequent processing steps, and can cause the release of small airborne HDP oxide particles which can land on the wafer surface and cause die loss.

Therefore, according to one aspect of the present invention, there is provided a method for fabricating a semiconductor device having a multilevel interconnect structure. On a semiconductor substrate, the surface of which comprises a conductive wiring pattern, an intermetal dielectric (IMD) is provided by depositing first and second dielectric layers. The first dielectric layer is comprised of a non-HDP dielectric layer, i.e., one that is formed by essentially any process other than high density plasma chemical vapor deposition. The first dielectric layer is generally one that can be deposited or otherwise formed in a controlled manner to a thickness less than about 200–500 Å. The second dielectric layer comprises an HDP oxide layer deposited on the upper surface of the first dielectric layer by a high density plasma chemical vapor deposition process. A third dielectric layer, such as a TEOS oxide layer, may be optionally deposited on the surface of the second dielectric layer, if desired. A plurality of titanium-titanium nitride-coated vias are formed through this intermetal dielectric structure and the vias are filled with a conductive material, such as tungsten.

Also provided by this invention are integrated circuits having multilevel interconnect structures. The multilevel interconnect structures comprise a conductive wiring pattern on the surface of a semiconductor substrate, a first dielectric layer comprised of a non-HDP dielectric layer, a second dielectric layer comprised of an HDP oxide layer on the surface of the first dielectric layer, and a plurality of titanium-titanium nitride-coated vias extending through at least one of the first and second dielectric layers. A third dielectric layer, such as a TEOS oxide layer, may be formed on the surface of the second dielectric layer.

BRIEF DESCRIPTION OF THE DRAWINGS

The invention may be understood by reference to the following description taken in conjunction with the accompanying drawings, in which like reference numerals identify like elements, and in which.

Figure 1:
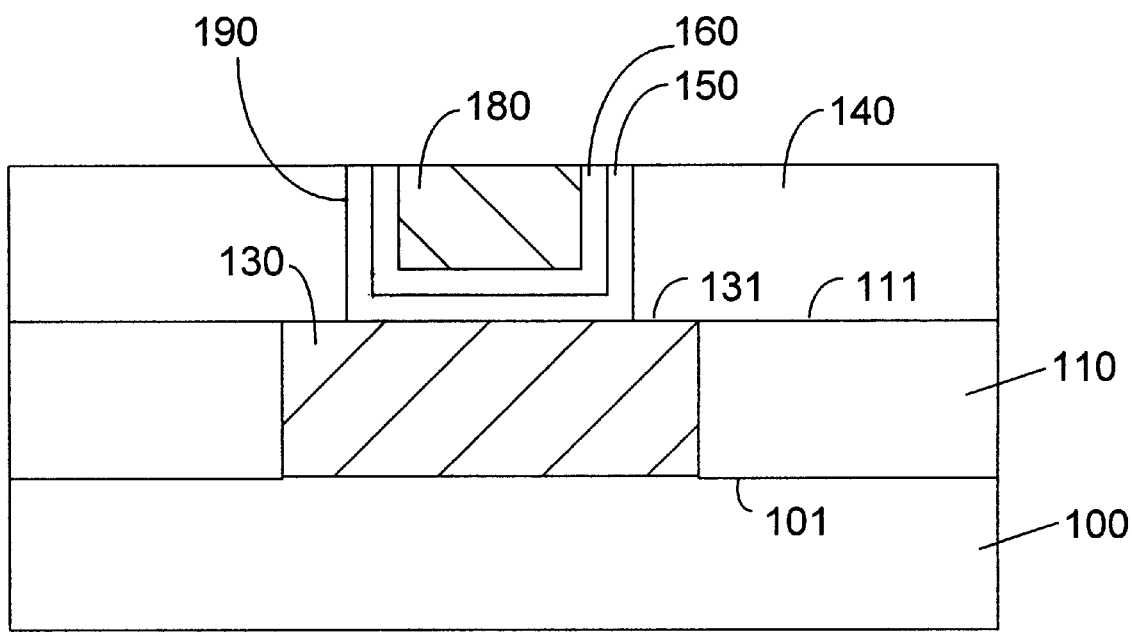
FIG. 1 illustrates a cross-sectional view of a prior art multilevel interconnect structure comprising an HDP oxide/TEOS oxide intermetal dielectric structure.
Figure 2:
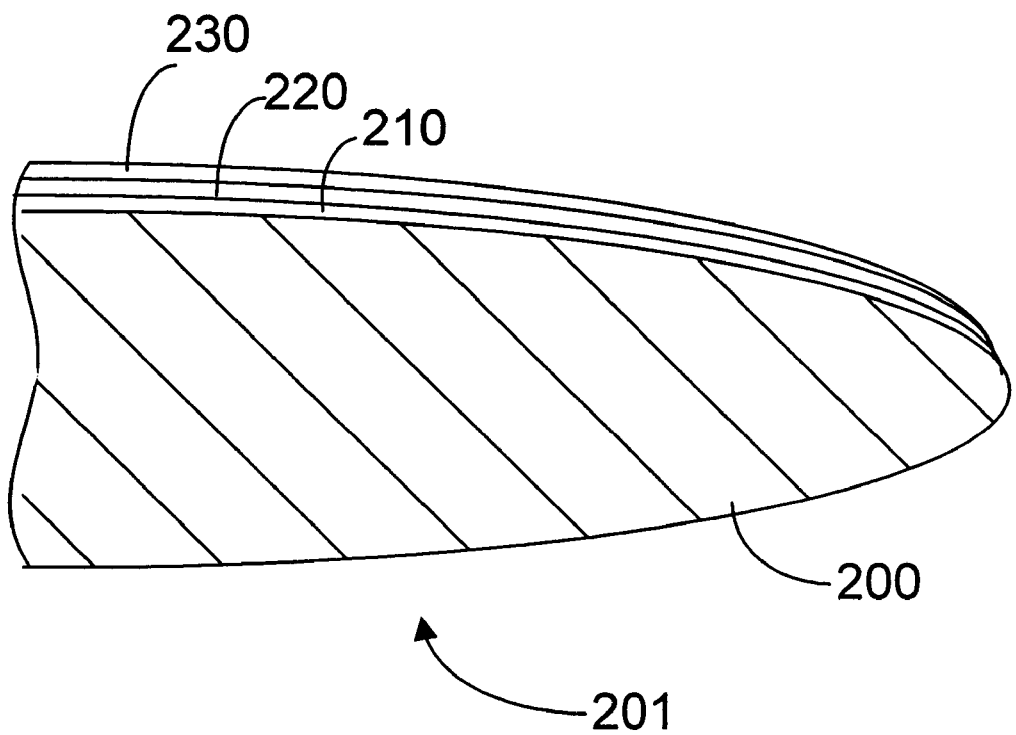
FIG. 2 is cross-sectional view of a semiconductor wafer edge at an intermediate stage during fabrication of a multilevel interconnect structure such as that depicted in FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers'specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 3A–3G. It should be noted, however, that the drawings are in a greatly simplified form, and are not intended to be inclusive of each and every step employed during the fabrication process. Moreover, although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

The problem addressed by the present invention stems from the poor interfacial properties, e.g., poor adhesion, between HDP oxide and titanium nitride. In a semiconductor fabrication process in which these two materials are in contact in any region on or above the surface of a semiconductor substrate, defects can occur as a result of localized delamination between these two materials during subsequent processing steps. Small bubbles may form at the interface region of the HDP oxide and the titanium nitride, some of which burst and release small airborne particles that can cause die loss if they land on the wafer surface. This problem has proven particularly problematic in a process for fabricating multilevel interconnect structures in high performance integrated circuits wherein these two materials are employed.

According to the present invention, the defects caused due to the presence of titanium nitride in contact with HDP oxide along the wafer edge can be substantially reduced by providing at least one layer of material between an HDP oxide layer and a titanium nitride layer to improve the interfacial properties between the HDP oxide and the titanium nitride during subsequent high temperature processing steps. Therefore, according to the present invention, an additional process layer is formed subsequent to titanium nitride deposition, but prior to HDP oxide deposition for the next level of interconnects. The process layer is thus formed between an HDP oxide layer and a titanium nitride layer that would otherwise come into direct contact along the edge of the wafer.

Figure 3A:
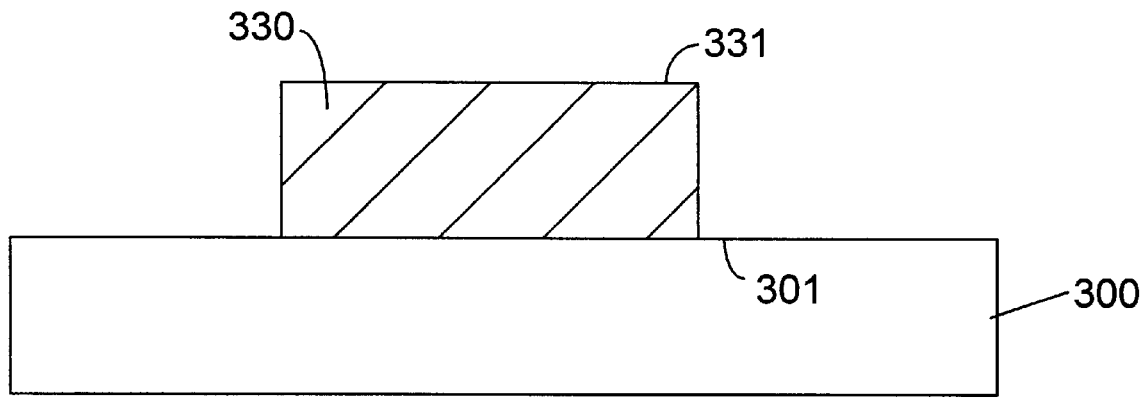
FIGS. 3A–3G illustrate cross-sectional views of selected steps in the fabrication of a multilevel interconnect structure according to the present invention.

One illustrative embodiment of the present invention will now be described with reference to FIGS. 3A–3G. As shown in FIG. 3A, an illustrative conductive line 330 comprised of, for example, aluminum, is formed above the surface of a semiconducting substrate 300. As will be readily apparent to one skilled in the art, the conductive line 330 may be formed above a component of a transistor, or other semiconducting device, that is formed above the surface of a semiconducting substrate. Alternatively, the conductive line 330 may be formed above one or more conductive elements, e.g., a conductive plug, used in multilevel interconnect fabrication schemes.

Figure 3B:
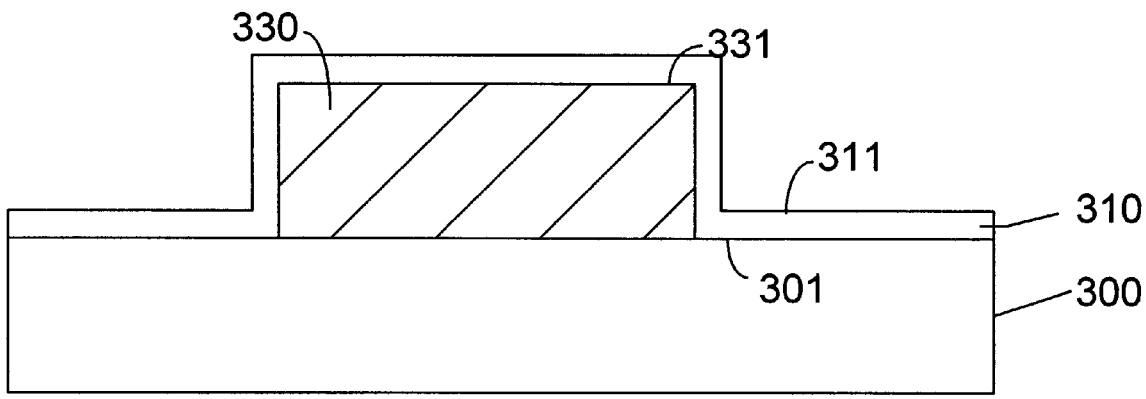

In FIG. 3B, a process layer 310 is formed above the surfaces 301 and 331 of the substrate 300 and the conductive line 330, respectively. The process layer 310 may be comprised of a variety of materials, including essentially any dielectric material formed by a process other than high density plasma chemical vapor deposition. It is believed that the presence of argon, and other like molecules, in an oxide layer deposited by high density plasma chemical vapor deposition may be responsible, at least in part, for the poor interfacial properties between HDP oxide and titanium nitride. Therefore, in one illustrative embodiment of the invention, the process layer 310 may be formed by essentially any process which does not introduce argon, or other like materials, into the resulting process layer 310. The process layer 310 will typically be formed by any one of a variety of suitable deposition techniques known and available in the art, such as chemical vapor deposition, and will generally be comprised of silicon dioxide, silicon nitride, or other like dielectric materials.

Although the thickness of the process layer 310 is not specifically restricted, the process layer 310 will generally be one that is capable of being deposited or otherwise formed to have a thickness ranging from approximately 200–500 Å, or less. The thickness of process layer 310 may be important in achieving adequate gap fill between the plurality of conductive lines 330 (only one of which is shown) formed above the substrate 300.

Figure 3C:
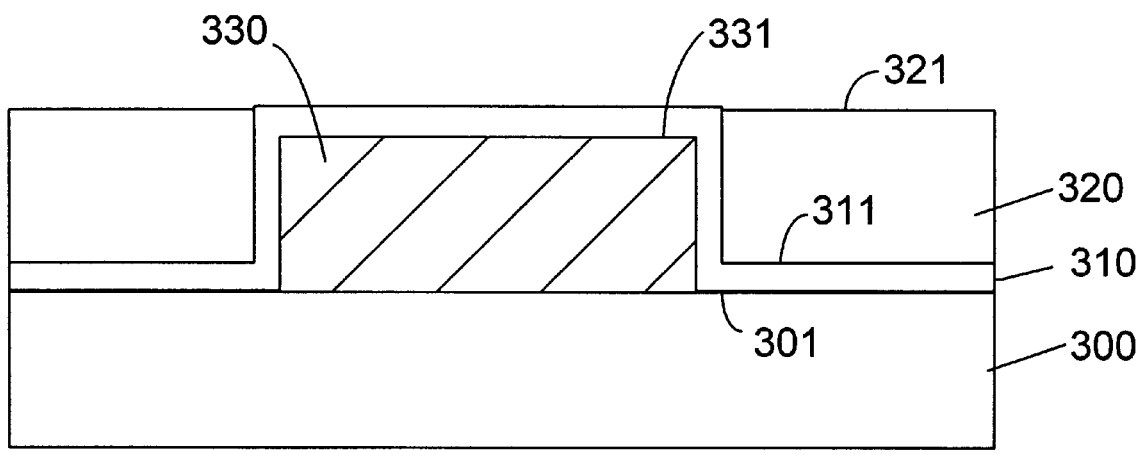

Turning to FIG. 3C, after the formation of the process layer 310, an HDP oxide layer 320 is formed above the surface 311 of process layer 310. The HDP oxide layer 320 may be formed by any high density plasma chemical vapor deposition process available in the art. The HDP oxide layer 320 may be formed to a thickness desired for a given application. Generally, the HDP oxide layer 320 will have a thickness in the range of about 6000 to 10,000 Å.

In one illustrative embodiment, the HDP oxide layer 320 is deposited by a high density plasma chemical vapor deposition process at a pressure in the range of about 1–20 millTorr, a temperature in the range of about 250–400° C., and an etch-to-deposition ratio between about 0.2–0.4. Gases that may be used for deposition/etching include $SiH_4$, $O_2$, argon, and other like gases.

Figure 3D:
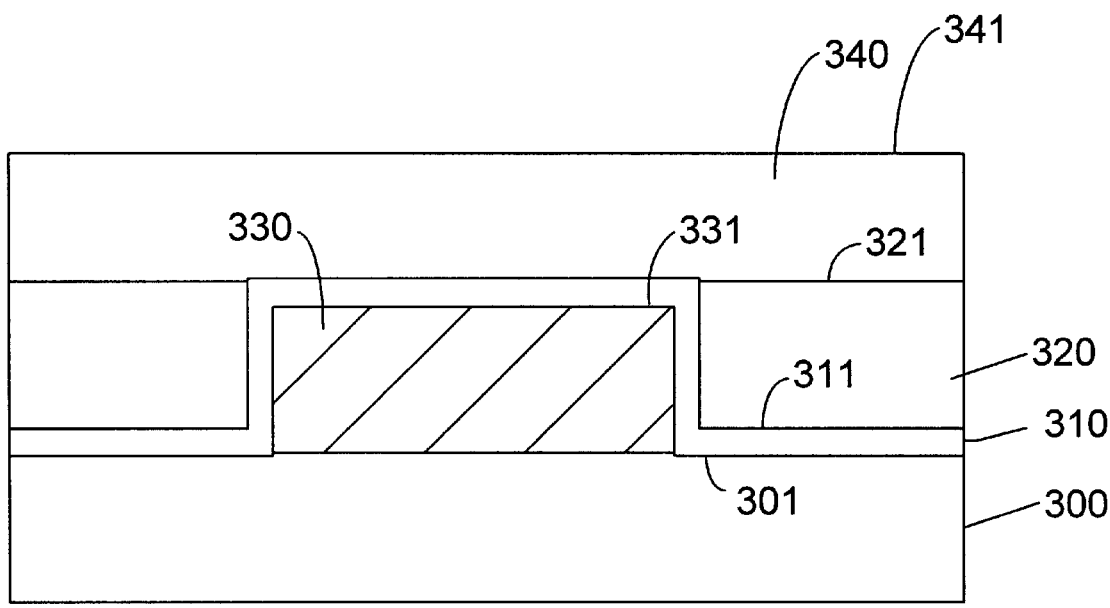

Turning to FIG. 3D, in a subsequent process, if desired, an additional dielectric layer 340 comprised of a material such as a TEOS oxide layer, may be formed above the upper surface 321 of the HDP oxide layer 320. Consequently, in this particular embodiment, the intermetal dielectric structure is comprised of three separately formed dielectric layers, the non-HDP dielectric layer 310, the HDP oxide layer 320, and the TEOS oxide layer 340.

Figure 3E:
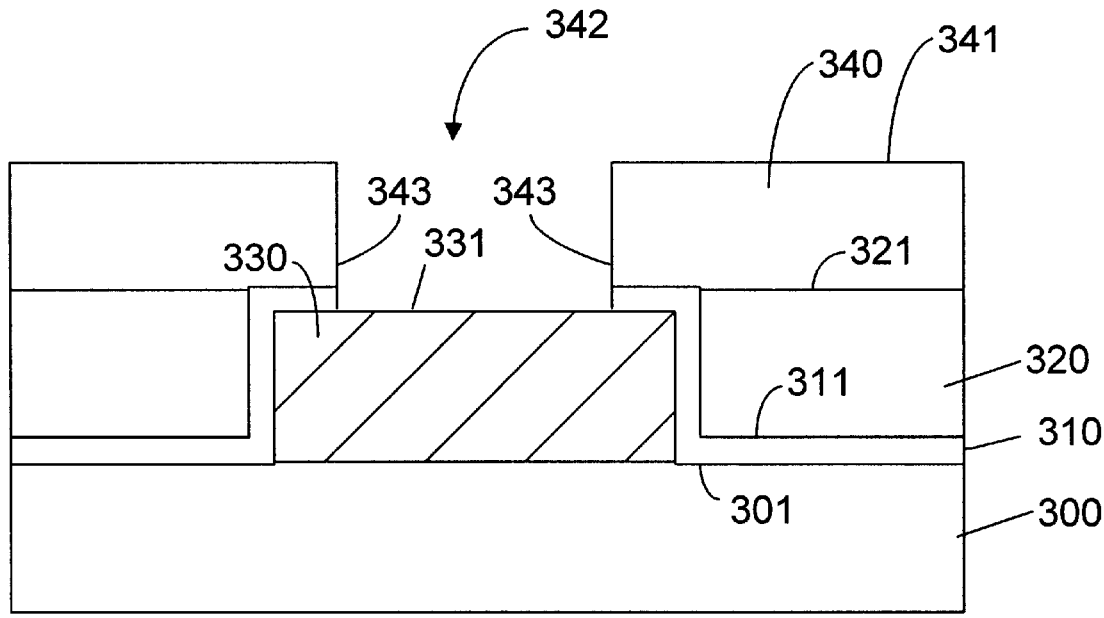

Turning to FIG. 3E, a via 342 is formed above the conductive line 330 by conventional photolithography and etching techniques. The via 342 will extend from the upper surface 341 to the upper surface 331 of the conductive line 330. Of course, depending on the thicknesses of the dielectric layers that are present, the via may extend through the dielectric layer 340, the HDP oxide layer 320 and/or the process layer 310.

Figure 3F:
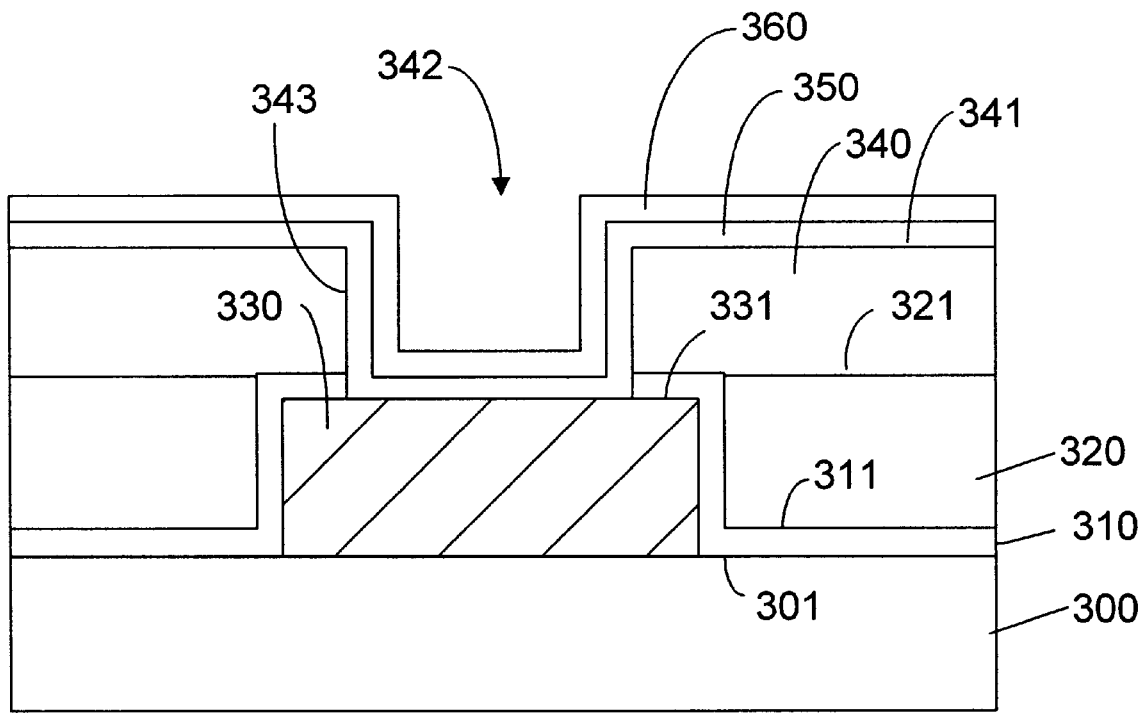

Turning to FIG. 3F, a titanium-titanium nitride barrier system is next provided within via 342. The titanium layer 350 is first formed above the surface 341 of the dielectric layer 340, along the sidewall surfaces 343 (see also FIG. 3E) of via 342, and above the surface 331 of the conductive line 330. Next, a titanium nitride layer 360 is formed above the surface of the titanium layer 350. The titanium layer 350 and the titanium nitride layer 360 may be formed by any of a variety of techniques available in the art, e.g., sputtering, CVD, and other like processes. The combined thickness of the titanium-titanium nitride barrier may be varied as a matter of design choice, but it will generally be in the range of about 100–500 Å. In one illustrative embodiment, the titanium layer 350 is in the range of approximately 50 to 300 Å thick, and the titanium nitride layer is in the range of approximately 50 to 300 Å thick.

Figure 3G:
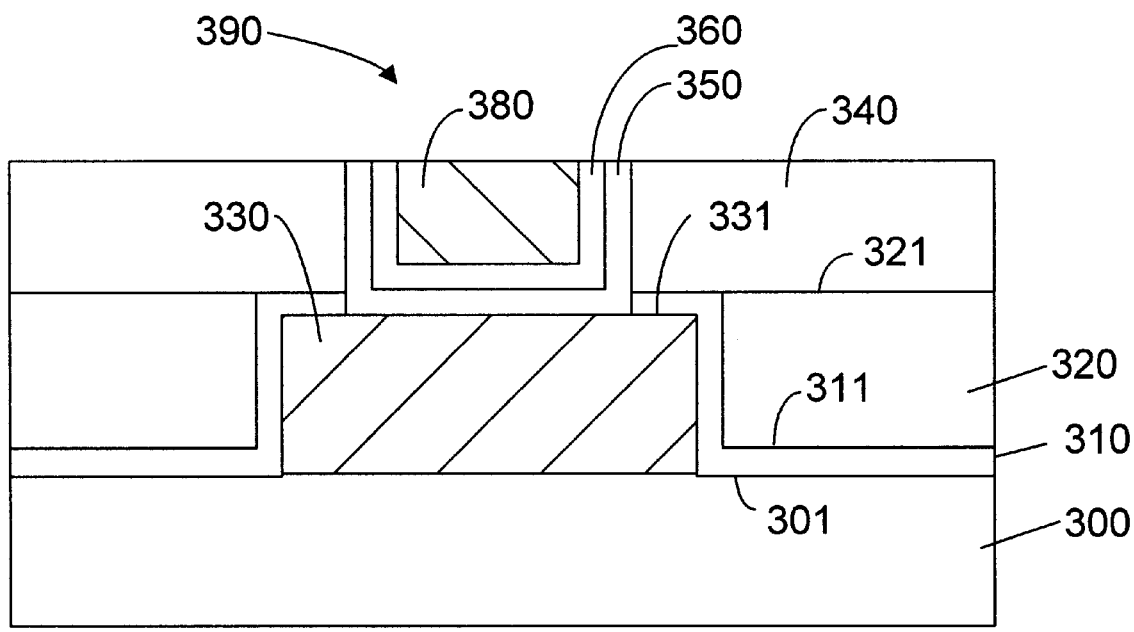

Thereafter, a conductive material, comprised of a suitable metal, such as tungsten, is formed above the surface of the wafer (not shown), so as to fill the titanium-titanium nitride-lined via 342. The tungsten, the titanium nitride layer 360 and titanium layer 350 are polished (e.g., by chemical mechanical polishing) or etched in one or more operations to be approximately planar with the surface 341 of dielectric layer 340, leaving a tungsten plug 380 within the via 342, and resulting in a tungsten plug interconnect structure 390, as depicted in FIG. 3G.

By introducing non-HDP dielectric layer 310 into the process flow as described, process yield is improved due to reduced defects. This is because the HDP oxide and titanium nitride that would normally stack up along the edge of the wafer are no longer in direct contact. Rather, the presence of the non-HDP dielectric layer improves the interfacial properties between the HDP oxide and titanium nitride, reducing their tendency for delamination along the wafer edge during subsequent high temperature processing steps. This, in turn, reduces die loss when compared with a process in which titanium nitride and HDP oxide are in direct contact.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified for use with many different semiconductor fabrication methods in which HDP oxide comes into contact with titanium nitride, and all such variations are considered within the scope and spirit of the invention. Accordingly, the protection sought herein is as set forth in the claims below.

What is claimed:

1. A method for fabricating a multilevel interconnect structure of an integrated circuit comprising:

forming at least one conductive line above the surface of a semiconductor substrate;

forming a first layer comprised of a non-HDP dielectric material above the surface of the semiconductor substrate;

forming a second layer comprised of a high density plasma oxide above the first layer;

forming a via above said at least one conductive line;

depositing a layer of titanium at least within said via;

depositing a layer of titanium nitride above said layer of titanium in said via; and filling the via with a conductive material.

2. The method of claim 1, wherein forming a first layer comprised of a non-HDP dielectric material above the surface of the conductive line and the semiconductor substrate comprises forming a first layer comprised of a non- HDP dielectric material having a thickness less than approximately 500 Å above the surface of the conductive line and the semiconductor substrate.

3. The method of claim 1, wherein forming a first layer comprised of a non-HDP dielectric material above the surface of the conductive line and the semiconductor substrate comprises forming a first layer comprised of a non-HDP dielectric material having a thickness less than approximately 200 Å above the surface of the conductive line and the semiconductor substrate.

4. The method of claim 1, wherein forming a second layer comprised of a high density plasma oxide above the first layer comprises forming a second layer comprised of a high density plasma oxide having a thickness that ranges from approximately 6000–10,000 Å above the first layer.

5. The method of claim 1, wherein forming a via above said at least one conductive line comprises forming a via through said first layer.

6. The method of claim 1, wherein forming a via above said at least one conductive line comprises forming a via through said second layer.

7. The method of claim 1, wherein forming a via above said at least one conductive line comprises forming a via through said first and said second layer.

8. The method of claim 1, further comprising forming a third layer above the surface of said second layer, said third layer being comprised of a dielectric material.

9. The method of claim 8, wherein forming a via above said at least one conductive line comprises forming a via through said third layer.

10. The method of claim 8, wherein forming a third layer above the surface of the second layer comprises forming a silicon dioxide or silicon nitride layer above said second layer.

11. The method of claim 8, wherein forming a third layer above the surface of the second layer comprises forming a TEOS oxide layer above said second layer.

12. The method of claim 1, wherein forming a first layer comprised of a non-HDP dielectric material above the surface of the conductive line and the semiconductor substrate comprises forming a first layer comprised of silicon dioxide or silicon nitride above the surface of the conductive line and the semiconductor substrate.

13. The method of claim 1, wherein forming a second layer comprised of a high density plasma oxide above the first layer comprises forming a second layer comprised of a high density plasma oxide above the first layer by a high density plasma chemical vapor deposition process.

14. The method of claim 1, wherein forming a second layer comprised of a high density plasma oxide above the first layer comprises depositing a second layer comprised of a high density plasma oxide above the first layer by a high density plasma chemical vapor deposition process at a pressure in the range of about 1 milliTorr to about 20 milliTorr.

15. The method of claim 1, wherein forming a second layer comprised of a high density plasma oxide above the first layer comprises depositing a second layer comprised of a high density plasma oxide above the first layer by a high density plasma chemical vapor deposition process at a temperature in the range of about 250° C. to about 400° C.

16. The method of claim 1, wherein forming a second layer comprised of a high density plasma oxide above the first layer comprises depositing a second layer comprised of a high density plasma oxide above the first layer by a high density plasma chemical vapor deposition process in which the etch-to-deposition ratio is in the range of about 0.2 to about 0.4.

17. The method of claim 1, wherein forming a second layer comprised of a high density plasma oxide above the first layer comprises depositing a second layer comprised of a high density plasma oxide above the first layer by a high density plasma chemical vapor deposition process which uses argon gas.

18. A method for reducing die loss in a process in which HDP oxide and titanium nitride are in contact above a semiconductor substrate, which process comprises providing between said HDP oxide layer and said titanium nitride layer a non-HDP dielectric interlayer.

19. The method of claim 18, wherein said, non-HDP dielectric layer has a thickness less than about 500 Å.

20. The method of claim 18, wherein said non-HDP dielectric layer has a thickness less than about 200 Å.

21. The method of claim 18, wherein said non-HDP dielectric layer is comprised of silicon dioxide or silicon nitride.

22. The method of claim 18, wherein said HDP oxide layer has a thickness in the range of about 6000–10,000 Å.

23. The method of claim 18, wherein said HDP oxide layer is formed by high density plasma chemical vapor deposition.

24. The method of claim 23, wherein said HDP oxide layer is formed by a high density plasma chemical vapor deposition process at a pressure in the range of about 1milliTorr to about 20 milliTorr.

25. The method of claim 23, wherein said HDP oxide layer is formed by a high density plasma chemical vapor deposition process at a temperature in the range of about 250° C. to about 400° C.

26. The method of claim 23, wherein said HDP oxide layer is formed by a high density plasma chemical vapor deposition process in which the etch-to-deposition ratio is in the range of about 0.2 to about 0.4.

27. The method of claim 23, wherein said HDP oxide layer is formed by a high density plasma chemical vapor deposition process which uses argon gas.

* * * * *